US006927574B2

(12) United States Patent
Young et al.

(10) Patent No.: US 6,927,574 B2
(45) Date of Patent: Aug. 9, 2005

(54) MAGNETIC RESONANCE APPARATUS INCLUDING AN RF MAGNETIC FLUX GUIDING STRUCTURE FOR IMPROVING THE SIGNAL-TO-NOISE RATIO

(75) Inventors: Robert Ian Young, Marlborough (GB); Michael Charles Keogh Wiltshire, Bucks (GB)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 10/220,730

(22) PCT Filed: Mar. 6, 2001

(86) PCT No.: PCT/GB01/00978

§ 371 (c)(1),
(2), (4) Date: Nov. 22, 2002

(87) PCT Pub. No.: WO01/67125

PCT Pub. Date: Sep. 13, 2001

(65) Prior Publication Data

US 2003/0155917 A1 Aug. 21, 2003

(30) Foreign Application Priority Data

Mar. 6, 2000 (GB) .............................. 0005351

(51) Int. Cl.⁷ .............................. G01V 3/00; H04B 3/28; H01P 1/26; H05K 9/00
(52) U.S. Cl. .................. 324/318; 333/12; 333/22 R; 333/24 R; 174/35 R; 174/35 MS; 324/300; 324/309; 324/303
(58) Field of Search .................. 324/318, 322, 324/314, 303, 309, 300; 335/282, 296, 216; 600/422, 423; 174/35 R, 35 MS; 333/22 R, 24 R, 12

(56) References Cited

U.S. PATENT DOCUMENTS 4,968,937 A  *  11/1990  Akgun ..................... 324/318
5,270,656 A  *  12/1993  Roberts et al. ............ 324/318

(Continued)

FOREIGN PATENT DOCUMENTS

EP          0 322 192 A      6/1989
EP          WO 2000/41270   * 7/2000
GB          WO 00/41270       7/2000
GB          WO 01/67126 A1    9/2001

OTHER PUBLICATIONS

J. B. Pendry, et al.; Magnetism from Conductors and Enhanced Nonlinear Phenomena', 1999', IEEE Trans. on Microwave Theory & Techniques, 47 (11), pp. 2075–2084.*

(Continued)

Primary Examiner—Brij Shrivastav
Assistant Examiner—Tiffany A. Fetzner
(74) Attorney, Agent, or Firm—John J. Fry (57) ABSTRACT

A pad which has a magnetic permeability greater than that of free space at the frequency of nuclear magnetic resonance but which is non-magnetic in steady magnetic fields is disposed between an RF coil and the surface of a patient. The pad is surmounted by a block having similar properties. Two further pads extend from the ends of the block to the surface of the patient. The pads and block guide magnetic flux, which is indicative of magnetic resonant active nuclei in the patient, towards an RF coil which is spaced apart from the surface of the patient/object under examination.

17 Claims, 4 Drawing Sheets

U.S. PATENT DOCUMENTS

| | | | | |
|---|---|---|---|---|
| 6,215,307 | B1 | * | 4/2001 | Sementchenko ............ 324/318 |
| 6,437,567 | B1 | * | 8/2002 | Schenck et al. ............ 324/318 |
| 6,608,811 | B1 | * | 8/2003 | Holden et al. ............... 361/303 |
| 6,768,051 | B2 | * | 7/2004 | Wiltshire et al. ......... 174/35 R |
| 6,801,173 | B2 | * | 10/2004 | Wiltshire .................... 343/787 |
| 6,819,106 | B2 | * | 11/2004 | Young et al. ................ 324/318 |
| 2003/0146801 | A1 | * | 8/2003 | Wiltshire et al. ............. 333/12 |
| 2003/0146802 | A1 | * | 8/2003 | Wiltshire et al. ......... 333/24 R |
| 2003/0146814 | A1 | * | 8/2003 | Wiltshire .................... 335/306 |
| 2003/0151408 | A1 | * | 8/2003 | Kruspe et al. .............. 324/303 |
| 2003/0155917 | A1 | * | 8/2003 | Young et al. ................ 324/318 |
| 2003/0155918 | A1 | * | 8/2003 | Young et al. ................ 324/318 |
| 2003/0155919 | A1 | * | 8/2003 | Pendry et al. .............. 324/318 |

OTHER PUBLICATIONS

Simultaneous Acquisition of Spatial Harmonics (SMASH): Fast Imaging with Radio Frequency Coil Arrays, Daniel K. Sodickson, Warren J. Manning, MRM38: 591–603 (1997).

Wiltshire M C K et al., "Microstructured Magnetic Materials For Rf Flux Guides In Magnetic Resonance Imageing", Science, Feb. 2, 2001, American Assoc. Adv. Sci, vol. 291, No. 5505, pp. 849–851.

D. Kwiat, et al.; A Decoupled Cell Detector Array for Fast Image Acquisition in Magnetic Resonance Imaging; 1991; 18 (2), pp. 251–265.

J.B. Pendry, et al.; Magnetism from Conductors and Enhanced Nonlinear Phenomena; 1999; IEEE Trans. on Microwave Theory & Techniques, 47 (11), pp. 2075–2084.

* cited by examiner

MAGNETIC RESONANCE APPARATUS INCLUDING AN RF MAGNETIC FLUX GUIDING STRUCTURE FOR IMPROVING THE SIGNAL-TO-NOISE RATIO

BACKGROUND OF THE INVENTION

This invention relates to signal-to-noise ratio improvement in magnetic resonance apparatus, such as magnetic resonance imaging apparatus or magnetic resonance spectroscopy apparatus.

Figure 1:
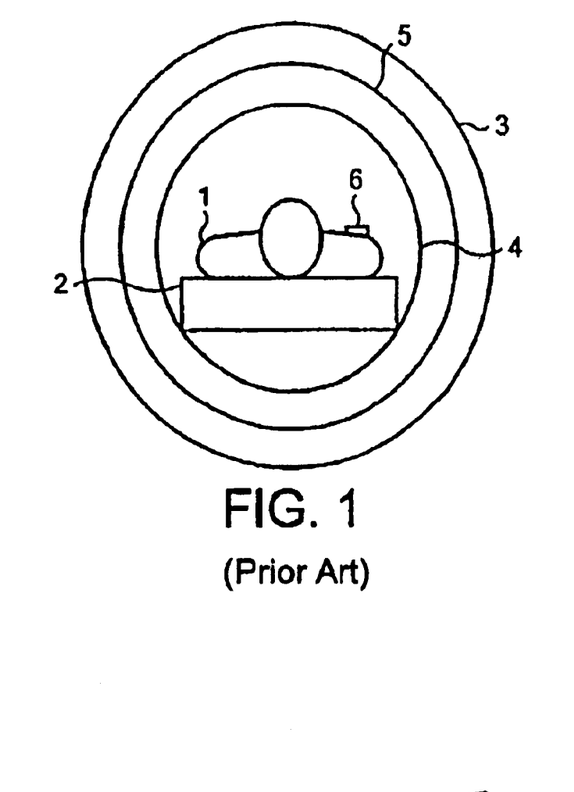
FIG. 1 is a schematic end view of part of known magnetic resonance imaging apparatus.

A typical magnetic resonance imaging apparatus is shown in FIG. 1. A patient 1 on a couch 2 is slid into the bore 3 of an annular electromagnet, typically a superconducting electromagnet. A main magnetic field is generated in alignment with the axis of the bore, and gradient coils (not shown) are provided to set up magnetic field gradients for example along the z-direction along the axis of the bore, and along x and y directions in the radial plane. A transmit coil 4 surrounds the patient and transmits pulses of r.f. energy to excite to resonance magnetic resonance active nuclei such as protons in the region of the patient to be examined. This transmit coil 4 is normally surrounded by an r.f. shield coil 5 to shield the bore 3 of the electromagnet from extraneous unwanted r.f. signals. The transmit coil 4 can be also be used to receive the magnetic resonance signals which result from the resonating protons in the region of interest, although a separate receive coil is often provided. For many examinations, a coil placed on the surface of the patient is used to receive the magnetic resonance signals, such as the coil 6 (shown on an enlarged scale in FIG. 2).

Figure 2:
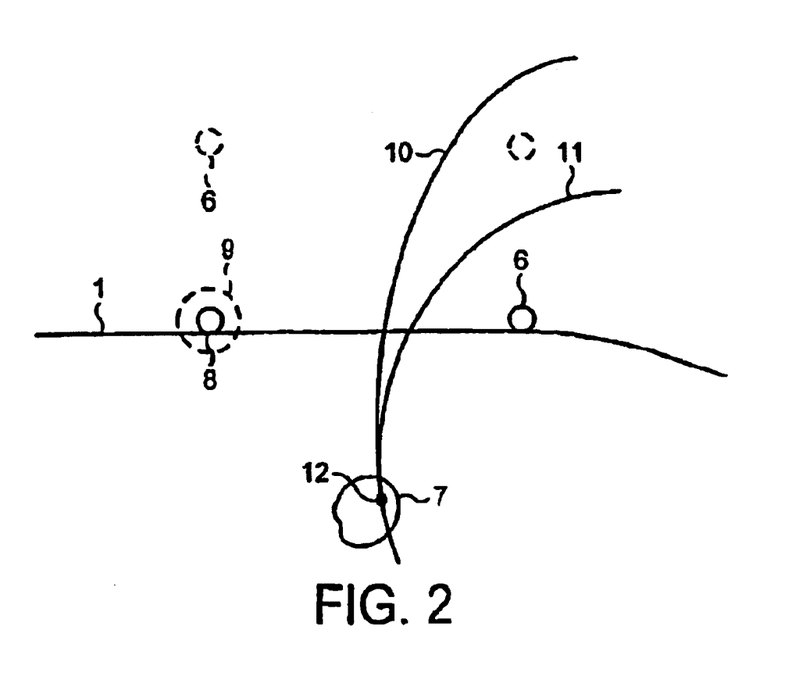
FIG. 2 is a sectional view through the plane of the receive coil in FIG. 1.

The signal picked up by the receive coil 6 is of course tiny. It might be necessary to collect data from a region of the body several times, with a consequent increase in the scanning time, in order to achieve satisfactory signal-to-noise ratio in the resulting image.

There are various sources of noise which accompany the desired magnetic resonance signal in the signal picked up by the receive coil 6.

In all except the lowest values of main magnetic field, the dominant noise is actually derived from the body rather than from the coil. Much of that noise comes from regions closest to the coil windings, which contribute a disproportionate amount relative to the value of the data obtained from them. The body has electrical resistances and associated with them noise voltages, and thus currents which generate the noise signals detected by the coil.

If the region it is desired to image is at some depth in the patient, as is often the case, (for example the region 7), the coil 6 is normally pressed as close to the patient's skin as practicable, because the strength of the signal from the region 7 is (simplistically) inversely proportional to the distance of the region 7 from the coil 6 (the signal strength being dependent on the so-called filling factor).

The disadvantage of this is an increase in noise from the regions of the body adjacent to the coil.

While the individual thermal sources of noise are of low intensity, there are many of them in the vicinity of the coil. For example, flux 9 (shown dotted) from one particular noise source 8 couples with the receive coil 6 (FIG. 2). There would be many such noise sources 8. Stronger flux 10, 11 emanating from a signal source 12 in the region of interest 7, would also couple with the receive coil 6.

The noise would be greatly reduced if the coil 6 was stood off from the surface of the patient such as to the position shown dotted, but the signal would also fall off to the extent that the signal-to-noise ratio would in fact be worse. To take the signal source 12 as an example, some of the flux such as 10 would still couple with the plane of the receive coil 5, but other flux 11 would not.

Another source of noise in the signal picked up by the coil 6 stems from the coil windings themselves, and this can be reduced by refrigerating the coils or by using superconducting coils. Because of the refrigeration, substantial thermal insulation is needed between them and the patient so removing them from the surface of the patient and, while the noise from the body is also thus reduced, there is still an overall loss of signal-to-noise ratio because of the loss of filling factor.

The applicants are aware that microstructures comprising an array of capacitive elements made from non-magnetic conducting material can exhibit magnetic permeability at radio frequencies (IEEE Transactions on Microwave Theory and Techniques, Vol. 47, No. 11, November 1999, Magnetism from Conductors and Enhanced Non-Linear Phenomena by J B Pendry, A J Holden, D J Robbins and W J Stewart, and International Patent Application WO 00/41270).

SUMMARY OF THE INVENTION

The invention provides magnetic resonance apparatus, in which resonance is excited in use in magnetic resonant active nuclei in a region of an object in the presence of a main magnetic field, including a structure with magnetic properties for guiding magnetic flux, the structure being made of a material having a magnetic permeability greater than that of free space at the frequency of nuclear magnetic resonance but being non-magnetic in steady magnetic fields, the material comprising an array of capacitive elements, the away exhibiting a predetermined magnetic permeability in response to incident electromagnetic radiation lying within a predetermined frequency band which includes the magnetic resonance frequency, wherein each capacitive element includes a conducting path and is such that a magnetic component of the electromagnetic radiation at the magnetic resonance frequency induces an electrical current to flow around said path and through said associated element, wherein the spacing of the elements is less than the wavelength of the radiation within the predetermined frequency band, and wherein the size of the elements and their spacing apart are selected such as to provide the magnetic permeability greater than that of free space at the magnetic resonance frequency.

The structure provides flexibility in the placement of components in the magnetic resonance apparatus.

Advantageously, the structure is interposed between the object and an r.f coil for receiving magnetic resonance signals generated by the magnetic resonant active nucleic to guide magnetic flux to the r.f. coil. Preferably, the r.f. coil is spaced from the surface of the object.

The structure enables the receive coil to be stood off from the surface of the object being examined without the usual loss of desired signal associated with spacing the receive coil from the object.

The structure dimensions may be typically no greater than that of the coil in axial projection over at least a part of the structure, although the area of the structure projected in this direction could be smaller than that the area of the coil in some arrangements.

Advantageously, the structure has a first region over which the magnetic permeability is greater than that of free space substantially in an axial direction with respect to the coil. Preferably, the structure has a second region over which the magnetic permeability is greater than that of flee space in a parallel direction to the axial direction, the first and second regions being spaced apart and joined by a third region to form a U-shape, the magnetic permeability of the third region being greater than that of fee space in a direction extending from the first region to the second region.

The third region is arranged to guide flux in a direction parallel to the object, and the first and second region are arranged to guide flux in a direction normal to the surface of the object. Further regions having the magnetic permeability greater than that of free space parallel to the coil axis may be provided, joined to the first region by appropriately orientated regions of magnetic permeability greater than that of free space.

In another embodiment, the structure may have a narrowed region, between two ends to be brought into contact with a patient, around which an␣␣r.f. receive coil is wound. In another embodiment, the structure may be peripherally-extending and surround an r.f. transmit coil such as a whole body, for example, birdcage coil, in order to act as a screen for the r.f. transmit coil. Suitable material for the structure is described in the IEEE article and in U.S. Pat. No. 6,608,811, the patent being incorporated herein by reference.

Preferably, at least one dimension of each capacitive element is less than the wavelength corresponding to the frequency of electromagnetic radiation exciting magnetic resonance.

The spacing of the elements may be less than one half, preferably less than one fifth, of the wavelength of the radiation at the magnetic resonance frequency. Further advantages may flow from making the element spacing less than one tenth, or less than one hundredth of the wavelength of the radiation at the magnetic resonance frequency.

The magnetic permeability of the structure may be in excess of 2, preferably in excess of 3, advantageously in excess of 5. The high value of magnetic permeability arises because of a steep rise in the graph of magnetic permeability with frequency, made possible because the magnetic permeability is negative over a part of the predetermined frequency band.

DRAWINGS

Ways in which the invention may be carried out will now be described in detail, by way of example, with reference to the accompanying drawings, in which.

Like reference numerals have been given to like parts throughout all the figures.

DETAILED DESCRIPTION

Figure 3:
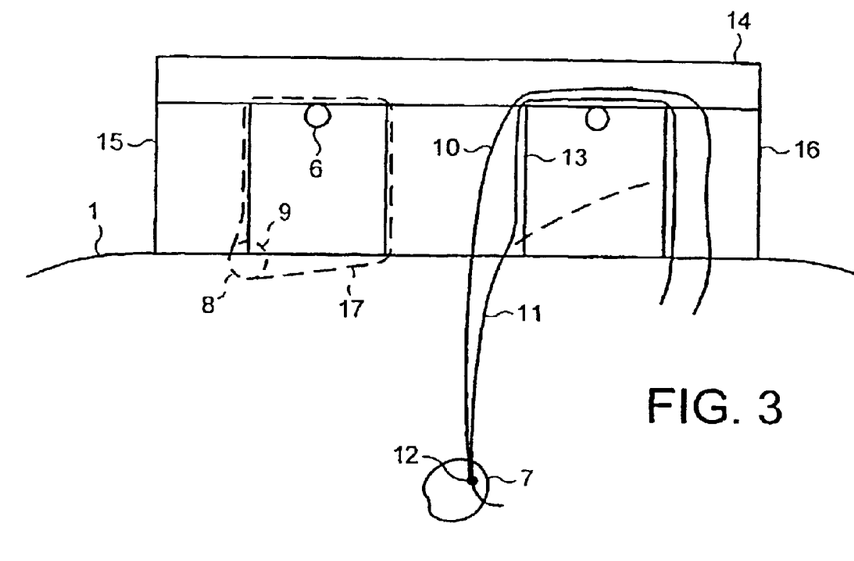
FIG. 3 is a sectional view through the plane of the receive coil and associated magnetically permeable material according to the invention.
Figure 4:
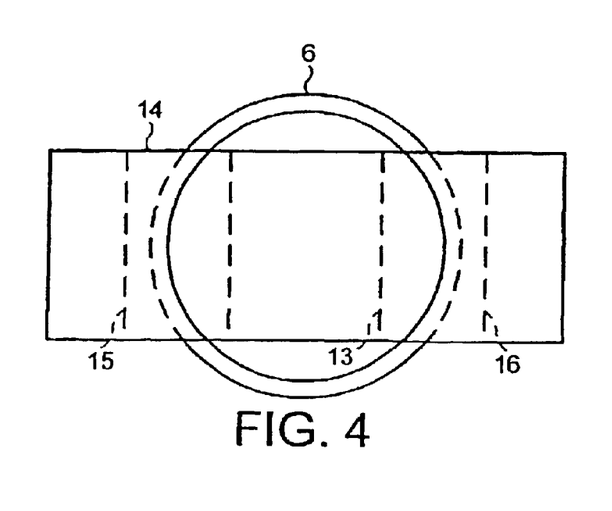
FIG. 4 is a plan view of the receive coil and magnetically permeable material of the invention.

The receive coil and structure with magnetic properties (magnetically permeable material) according to the invention shown in FIGS. 3 and 4 is used in the known magnetic resonance imaging apparatus as described above with reference to FIG. 1. However, instead of the receive coil 6 being pressed against the surface of the patient as shown in FIG. 2, the receive coil 6 is spaced from the patient. As was described with reference to FIG. 2, this would be responsible for a reduction in body noise in the signal received by the receive coil 6, but at the expense of a loss of signal strength from the desired region 7.

In the arrangement of FIGS. 3 and 4, however, a pad 13 is interposed between the r.f. coil 6 and the surface of the patient 1, the pad having a magnetic permeability much greater than that of free space at the nuclear magnetic resonance frequency substantially in a direction perpendicular to the plane of the coil 6, while having the magnetic permeability of free space, that is, a relative permeability of unity i.e. being nonmagnetic, in other directions at the magnetic resonance frequency, and in all directions in steady magnetic fields. The pad is surmounted by a block 14 which also has a permeability much greater than that of free space at the nuclear magnetic resonance frequency, substantially in a direction parallel to the plane of the receive coil 6 and parallel to the length of the block, while being non-magnetic at the resonance frequency in other directions and in all directions in steady magnetic fields.

The arrangement of material of high permeability at the magnetic resonance frequency is completed by two further pads 15 and 16 which extend from the ends of the block to the surface of the patient. The pads 15 and 16 have a permeability much greater than that of free space at the nuclear magnetic resonance frequency substantially in a direction extending from the block 14 to the patient 1, but which are non-magnetic in other directions at the magnetic resonance frequency and in all directions in steady magnetic fields.

It can thus be seen that the double U-shaped structure with magnetic properties, comprising pads 13, 15 and 16 and the block 14, act as an r.f. flux guide which concentrates r.f. flux through the pads 13, 15, 16 and along the block 14.

As an example, flux 10 from a signal source 12 in a region of interest 7 is guided up the central pad 13, along the block 14 and down the pad 16 (or in the reverse direction). In addition, flux 11 which failed to couple with the coil 6 when the coil was stood away from the surface of the patient as shown in FIG. 2 (the dotted path shown in FIG. 3) is now guided along pad 13, block 14 and pad 16, and does now therefore couple with the coil 6.

The noise signals from close to the surface of the patient are not channelled to any significant extent through the pads 13, 15, 16 and block 14, because the reluctance of those paths (for example, flux path 17 from noise source 8) is greater than for those paths through air and tissue (for example, flux path 9 from noise source 8). The reluctance of the paths followed by flux from deep sources of signal (and noise) is, at worst, very little increased by the path through pads 13, 15, 16 and block 14, and may be significantly reduced from the equivalent path in their absence. As a result, as the noise sources such as 8 are the predominant generators of noise, there is an effective gain in signal-to-noise ratio.

Because the receive coil 6 is spaced from the surface of the patient, it is now possible to cool it, or to replace it with a superconducting coil, to take advantage of the extra space available for the coil and achieve a consequent further reduction in noise.

The improvement in signal-to-noise ratio in the received magnetic resonance signals permits better images to be produced, or a shorter scanning time to be used, or both. Because the microstructured material is tuned to exhibit magnetic permeability only at the frequency of nuclear magnetic resonance, the material is not affected by the main magnetic field or by gradient magnetic fields.

Variations may of course be made to the shape of the flux guide 13, 15, 16, 14. Thus, for example, the block 14 could be circular and the pads 15 and 16 could be replaced by a hollow cylindrical wall which extended from the outer margin of the circular block 14 to an annular region on the patient. The pad would have a high magnetic permeability at the magnetic resonance frequency in a direction extending towards the patient, whereas the block 14 would have a high magnetic permeability in radial directions in its plane.

As another alternative, the rectangular block of FIGS. 3 and 4 could be arched compared to the flat shape shown in FIG. 3. In fact, the pad 14 could be extended in a lengthwise direction to terminate over a further pad similar to the pads 13, 15, 16, and a further coil 6 could be centred on the pad 15. In fact, this could be continued around the surface of the patient to any desired extent. An arrangement would be possible where the block 14 was extended lengthwise until it surrounded the entire circumference of the patient, or of a part of the patient's anatomy, with pads similar to the pads 13, 15, 16 being arranged at intervals between the circumferential block and the patient, extending in a radial direction from the block 14 to the patient. An array of coils could then be provided, a different coil being provided around each radial pad.

The coils of the array could be separated by controllable screens as described in our U.S. Patent Publication 20030155918, the contents of which are incorporated herein by reference.

The pads and the blocks may be made of micro structured material made from non-magnetic conducting material but exhibiting a high magnetic permeability at the magnetic resonance frequency, as described in the IEEE publication and pending International Patent Application WO 00/41270. For example, the block 14 could consist of an array of rolls of non-magnetic conducting sheets arranged with their axes arranged lengthwise relative to the block. In the case where the block is arched, the rolls could extend along the block with the same curvature as the block, or alternatively the rolls could be arranged in short straight sections which are angled relative to each other. The pads could consist of arrays of rolls of non-magnetic conducting sheets arranged parallel to the axes of the pads, or the pads could consist of arrays of capacitive elements consisting of at least one turn, arranged in columns.

The flux will follow the path of the rolls, or the columns, and in order to accommodate the change in direction between the vertical flux path of the pads and the horizontal flux path of the block (as seen in FIG. 3), the rolls or columns could be curved at the transition. In another possible implementation (FIG. 5), the top ends of the pads 13, 15, 16 are bevelled, and the block 14 is formed in two parts with correspondingly bevelled ends. A few rolls 13a–16a have been shown schematically in each of the parts to indicate their orientations.

As an example of suitable dimensions, a typical small surface coil for the embodiment of FIGS. 2 to 4 could be of square section, with one, two or three turns at its edge. If the inner turn had dimensions of 100 mm by 100 mm, the block could be about 90 mm by 90 mm in section (the view of FIG. 4), and result from close packing rolls of non-magnetic conducting material on a thin non-conducting substrate, with an outer diameter of about 11 mm, the axes of the rolls being parallel to the axes of the pads (and of the coils 6). The pads might each be an 8 by 8 matrix with a height of 25 mm. The effective magnetic permeability would be greater than unity at 21.3 MHz (the resonant frequency of protons in a 0.5 Tesla magnetic resonance imaging machine).

For the case where the pads are made from layers of turns which could be fabricated or a printed circuit, the pads would be made of say 25 layers, each 1 mm thick, to build up the height of the pads, and for this version, the effective relative permeability at the magnetic resonant frequency could reach 40.

EXAMPLE

In one example of roll material, the material consists of cylindrical elements, with each cylinder being a "Swiss Roll". They are made of 37 turns of film, wound on a 8 mm diameter, non-magnetic core (a glass-reinforced plastic, GRP, rod). The film is a proprietary material, known as ProFilm (Trade Mark), which consists of a Mylar (Trade Mark) base, coated with about 10 nm of aluminium and a glue layer, the whole being approximately 50 $\mu$m thick. The sheet resistance of the aluminium layer is about 2.7 $\Omega$/square. The outer diameter of the cylinders is 11.4 mm, and the material is assembled in a hexagonal close packed lattice (i.e. as closely packed as possible). This construction provides a maximum permeability of $\mu$=3 at 21.3 MHz and a permeability of air at other frequencies and steady state fields.

In another example, an alternative film is provided by the so-called "Superinsulation" (Trade Mark) used in superconducting magnet systems. This is a Mylar (Trade Mark) film of thickness 6.4 $\mu$m, coated with aluminium up to 50 nm thick. The sheet resistance of such a layer is ~0.5 $\Omega$/square. If this material is wound for 18.7 turns onto a 6 mm diameter mandrel, the outer diameter becomes 6.4 mm, and the maximum permeability is $\mu$=4.9 at 21.3 MHz, and of air at other frequencies and steady fields.

A significantly larger permeability can be achieved by including an additional Mylar interlayer. If the interlayer is 50 $\mu$m thick, so that the total layer thickness is 56.4 $\mu$m, then a permeability of $\mu$=19.2 is obtained using 58.62 turns on a 6 mm mandrel, with an outer diameter of 12.6 mm.

Even greater permeabilities can be achieved by using more conductive films. In the above example, if the sheet resistance were reduced to 0.1 $\Omega$/square, either by using a thicker film of aluminium or by using a different metal (such as silver), the permeability would be increased to 76.7.

The achievable permeability depends on the frequency: the lower the frequency, the larger the permeability, and conversely. Using the example above of a 56.4 $\mu$m thick layer, with a sheet resistance of 0.5 $\Omega$/square, wound on a 6 mm diameter mandrel, using 113 turns provides a an outer diameter of 18.8 mm and a permeability of 23.8 at 10.6 MHz, whereas 14.5 turns (with an outer diameter of 7.6 mm)

provides μ=11. Clearly, reducing the sheet resistance by increasing the metal thickness will increase the achievable permeability. Again, the permeability is that of free space at other frequencies and in steady fields.

Figure 5:
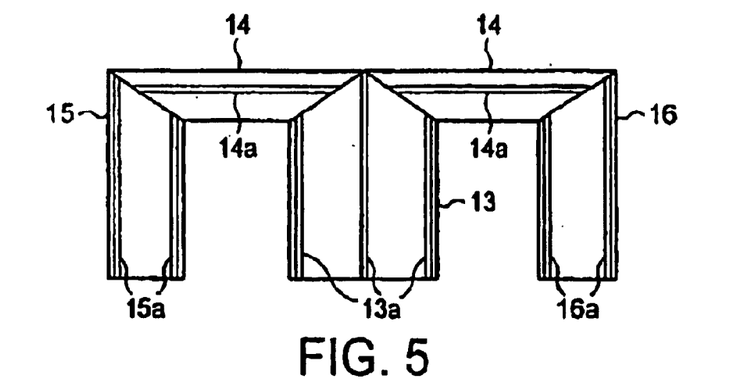
FIG. 5 is a sectional view of the magnetically permeable material corresponding to FIG. 3 in one implementation.
Figure 6:
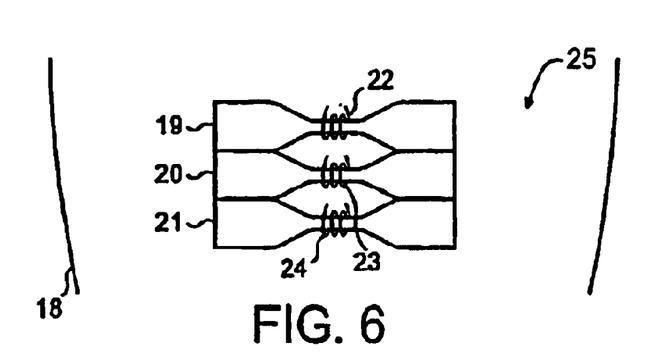
FIG. 6 is a plan view of a structure with magnetic properties for guiding magnetic flux in accordance with the invention positioned for imaging above an abdomen.
Figure 7:
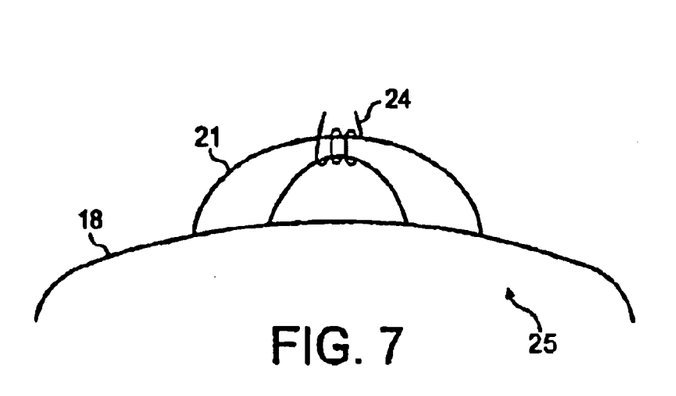
FIG. 7 is a front view of the structure shown in FIG. 6.

An alternative form of flux guide to that shown in FIGS. 3 to 5 is shown in FIGS. 6 and 7, in which a portion of a human abdomen 18 is illustrated, in the imaging region of magnetic resonance imaging apparatus.

In order to image a sensitive region 25, instead of a surface coil being placed on the nearest region of the surface of the patient, paddle-shaped flux guides 19, 20, 21 are placed on the surface of the patient in order to duct flux from the regions of the ends of the guides through the guides and, in particular, through the narrow neck region at which a receive coil 22, 23, 24 is wound, where the magnetic resonance signal may be picked up.

There are two advantages of such an arrangement. The receive coils 22 to 24 are spaced from the surface of the patient and can therefore be refrigerated. Secondly, the region of the patient immediately above the sensitive region 25 is left free in order for possible invasive surgery to take place which can be monitored in real time by viewing the magnetic resonance image. Another advantage is that there is no mutual inductance between the guides 19, 20, 21, allowing the receive coils to be used in conjunction with techniques which use an array of coils to enable image space to be undersampled by relying on coil relative position and sensitivity profiles to generate missing data (Simultaneous Acquisition of Spatial Harmonics (SMASH): Fast Imaging with Radio Frequency Coil Arrays, Daniel K Sodickson, Warren J Manning, MRM38: 591–603 (1997)).

Typical values of the magnetic permeability are in excess of 4.

While the structure with magnetic properties has been described with reference to the guiding of flux to an r.f. receive coil, the structure could be used for any other flux-guiding purpose in a magnetic resonance apparatus. For example, the structure could be used for guiding transmit flux from an r.f. coil, for imaging or for spectroscopy. Equally, the surface structure of the invention may be used to perform a screening function.

Figure 8:
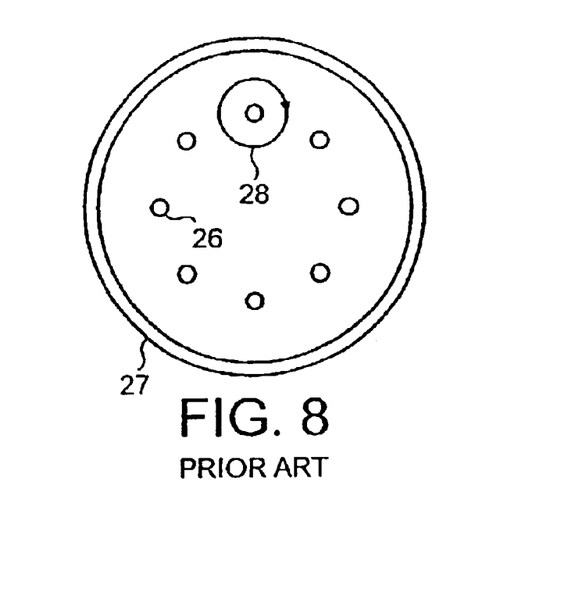
FIG. 8 is a schematic axial sectional view through a part of magnetic resonance imaging apparatus employing a known r.f. screen.

Thus, referring to FIG. 8, which represents a magnetic resonance imaging apparatus, magnetic resonance is excited in a whole body typically using a so-called birdcage coil, consisting of a number of conductors 26 which extend along the surface of a notional cylinder and are joined by rings at each end of the notional cylinder. This is used to generate r.f. excitation pulses to excite resonance in a sensitive region being imaged. Clearly, such a birdcage coil will also emit r.f. radiation outwardly as well as inwardly to the desired region, and such radiation would couple with the metal of the imaging apparatus surrounding the coil, which would distort the r.f. magnetic fields and affect machine performance. For this reason, it is standard practice to employ a mesh screen 27 to dissipate the power from the r.f. pulses through eddy currents in the screen. In practice, such a conventional screen cannot be too close to the conductors since then most of the r.f. power is dissipated in the screen.

Figure 9:
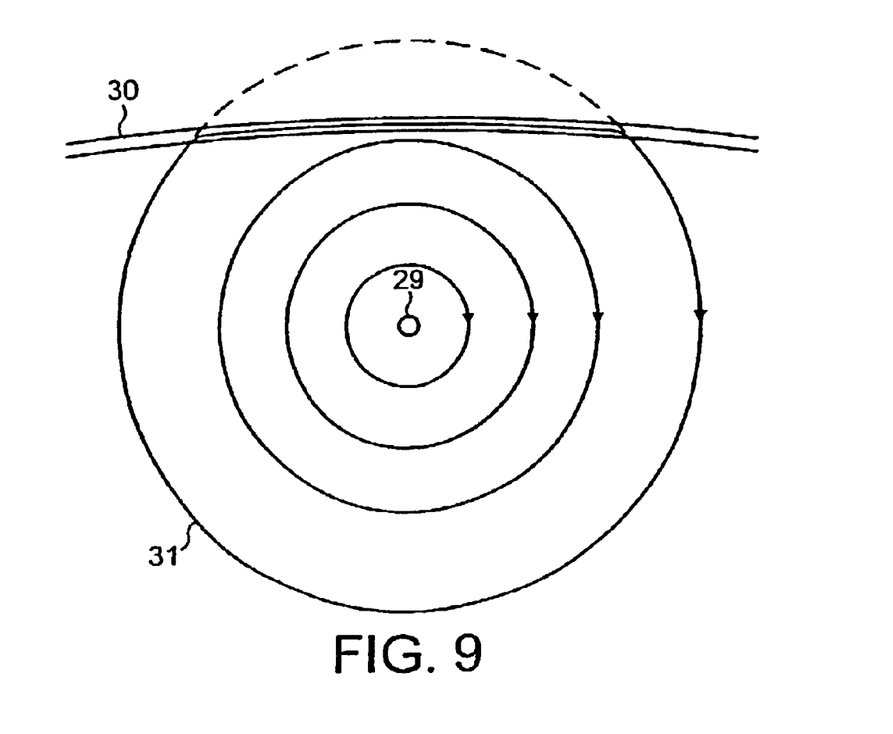
FIG. 9 is an enlarged cross-sectional view, compared to FIG. 8, of a part of a magnetic resonance imaging apparatus employing a structure with magnetic properties for guiding magnetic flux in accordance with the invention.

Referring to FIG. 9 which is on a greatly enlarged scale compared to FIG. 8, a single conductor 29 of a birdcage coil is shown and a surface structure 30 used to perform the function of a screen 27, circular like that of FIG. 8, is arranged more closely adjacent thereto than is the screen 27 of the prior art arrangement of FIG. 8. The surface structure 30 acts as a flux guide, so that, as far as the flux line 31 is concerned, there is a lower reluctance path along the guide than along the path (shown dotted) it would have taken if the guide were not present.

Typical magnetic permeabilities for this case would be substantially greater than 1, preferably greater than 2, advantageously greater than 4.

One advantage of the screening surface structure 30 is that the structure can be placed nearer to a conductor 29 of the birdcage coil than hitherto. A second advantage is that the flux is ducted around the screening surface structure, rather than being dissipated, so that less power is needed in the means to generate the r.f. excitation pulse.

While the receive coil and associated flux guide are described above with reference to an annular electromagnet, the invention is also applicable to other configurations of magnet, such as open or permanent magnets. Also, the invention is applicable to magnetic resonance spectroscopy. The pad and block may also be non-magnetic in audio-frequency magnetic fields. The term "permeability" as used in the Examples means "relative permeability".

What is claimed is:

1. Magnetic resonance apparatus, in which resonance is excited within magnetic resonant active nuclei in a region of an object in the presence of a main magnetic field, including a guide structure with magnetic properties which guides magnetic flux, wherein the guided magnetic flux is indicative of magnetic resonant active nuclei in an object under examination, the guide structure having a magnetic permeability greater than that of free space at the frequency of nuclear magnetic resonance but being non-magnetic in steady magnetic fields, the guide structure comprising an array of capacitive elements, the array exhibiting a predetermined magnetic permeability in response to incident electromagnetic radiation lying within a predetermined frequency band which includes the magnetic resonance frequency, wherein each capacitive element includes a conducting path and is such that a magnetic component of the electromagnetic radiation at the magnetic resonance frequency induces an electrical current to flow around said path and through said capacitive element, wherein the spacing between the capacitive elements is less than the wavelength of the radiation within the predetermined frequency band, and wherein the size of the capacitive elements and their spacing apart are selected in order to provide the magnetic permeability greater than that of free space at the magnetic resonance frequency.

2. Magnetic resonance apparatus as claimed in claim 1, in which the guide structure is interposed between the object under examination and an RF coil in order to receive magnetic resonance signals generated by the magnetic resonant active nuclei, and guide magnetic flux to the RF coil.

3. Magnetic resonance apparatus as claimed in claim 2, in which the RF coil is spaced apart from the surface of the object under examination.

4. Magnetic resonance apparatus as claimed in claim 3, in which the rf coil has an axis with a projection, and wherein the dimensions of the guide structure are such that at least a part of the guide structure lies within the periphery of the projection of the axis of the rf coil towards the surface of the object under examination.

5. Magnetic resonance apparatus as claimed in claim 3, in which the guide structure has a first region over which the magnetic permeability is greater than that of free space substantially in an axial direction with respect to the coil.

6. Magnetic resonance apparatus as claimed in claim 5, in which the guide structure has a second region over which the magnetic permeability is greater than that of free space in a parallel direction to the axial direction, the first and second regions being spaced apart and joined by a third region forming a U-shape, the magnetic permeability of the third region being greater than that of free space in a direction extending from the first region to the second region.

7. Magnetic resonance apparatus as claimed in claim 3, in which the r.f. coil is refrigerated.

8. Magnetic resonance apparatus as claimed in claim 1, in which the guide structure has two regions arranged adjacent to the object under examination, and a central region of smaller diameter around which extends an rf receive coil.

9. Magnetic resonance apparatus as claimed in claim 8, in which a plurality of such guide structures are arranged side by side.

10. Magnetic resonance apparatus as claimed in claim 1, in which the guide structure also exhibits a negative magnetic permeability over a part of the predetermined frequency band.

11. Magnetic resonance apparatus as claimed in claim 1, in which the apparatus also comprises a magnetic resonance imaging apparatus.

12. Magnetic resonance apparatus as claimed in claim 1, in which the capacitive elements are planar rings or spirals.

13. Magnetic resonance apparatus as claimed in claim 12, in which the capacitive elements are stacked in columns.

14. Magnetic resonance apparatus as claimed in claim 1, in which the capacitive elements comprise conductive sheets on insulating substrates wound as rolls.

15. Magnetic resonance apparatus as claimed in claim 1, in which the spacing of the capacitive elements is less than one half of the wavelength of radiation at the magnetic resonance frequency.

16. Magnetic resonance apparatus as claimed in claim 1, in which the spacing of the capacitive elements is less than one fifth of the wavelength of radiation at the magnetic resonance frequency.

17. Magnetic resonance apparatus as claimed in claim 1, in which the spacing of the capacitive elements is less than one tenth of the wavelength of radiation at the magnetic resonance frequency.

* * * * *